(12) United States Patent
Held et al.

(10) Patent No.: US 10,813,256 B2
(45) Date of Patent: Oct. 20, 2020

(54) EXTERNAL STRUCTURE HEAT SINK

(71) Applicant: Schlumberger Technology Corporation, Sugar Land, TX (US)

(72) Inventors: Kurt Held, Houston, TX (US); Nick Paul Krippner, Houston, TX (US); Kasey Herman, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 16/537,670

(22) Filed: Aug. 12, 2019

(65) Prior Publication Data

US 2020/0100385 A1 Mar. 26, 2020

Related U.S. Application Data

(62) Division of application No. 15/664,041, filed on Jul. 31, 2017, now Pat. No. 10,390,466.

(60) Provisional application No. 62/370,229, filed on Aug. 2, 2016, provisional application No. 62/368,705, filed on Jul. 29, 2016.

(51) Int. Cl.
*H05K 7/20* (2006.01)

(52) U.S. Cl.
CPC ......... *H05K 7/209* (2013.01); *H05K 7/20909* (2013.01); *H05K 7/20927* (2013.01)

(58) Field of Classification Search
CPC ......... H01L 2924/00; H01L 2924/0002; H01L 2924/00014; H01L 2224/48091; H01L 2224/48227; H01L 2224/32225; H01L 2224/73265; H01L 21/67115; H05K 7/20936; H05K 7/20927; H05K 7/1432; H05K 7/20327; H05K 7/209; H05K 1/0203

See application file for complete search history.

(56) References Cited

U.S. PATENT DOCUMENTS

| | | |
|---|---|---|
| 3,696,634 A | 10/1972 | Ludin et al. |
| 3,821,881 A | 7/1974 | Harkias |
| 4,842,911 A | 6/1989 | Fick |
| 6,144,556 A * | 11/2000 | Lanclos ............. H05K 7/20145 361/695 |
| 6,336,338 B1 | 1/2002 | Koren |
| 2002/0184906 A1 | 12/2002 | Faries |
| 2003/0103343 A1 * | 6/2003 | Tozune .................. G06F 1/181 361/823 |
| 2003/0169566 A1 | 9/2003 | Owens et al. |
| 2004/0012983 A1 | 1/2004 | Fearing et al. |
| 2004/0085728 A1 | 5/2004 | Barth et al. |
| 2007/0091276 A1 * | 4/2007 | Zakoji .................... G03B 21/16 353/54 |

(Continued)

*Primary Examiner* — Adam B Dravininkas
(74) *Attorney, Agent, or Firm* — Rachel E. Greene

(57) ABSTRACT

Systems and methods for dissipating heat from an electrical component using an external structure of a trailer or shed as a heat sink are disclosed. A heat-producing electrical component such as a variable frequency drive (VFD) using an insulated-gate bipolar transistor (IGBT) is housed in a trailer and is thermally coupled to an exterior wall of the trailer to use the wall as a heat sink to dissipate heat from the VFD and IGBT. An adapter can be used to couple VFDs and IGBTs of different sizes and configurations to a support site on the exterior wall.

9 Claims, 5 Drawing Sheets

(56) References Cited

U.S. PATENT DOCUMENTS

| | | | |
|---|---|---|---|
| 2009/0139245 A1* | 6/2009 | Blackway | F25B 21/02 62/3.62 |
| 2014/0298846 A1* | 10/2014 | Taras | H05K 7/20918 62/291 |
| 2014/0332182 A1 | 11/2014 | Taras et al. | |
| 2015/0198321 A1* | 7/2015 | Druchinin | H05B 45/50 362/235 |
| 2018/0023777 A1* | 1/2018 | Roucoules | F21V 29/59 362/508 |

\* cited by examiner

EXTERNAL STRUCTURE HEAT SINK

This application claims priority as a divisional application of U.S. nonprovisional application Ser. No. 15/664,041 with the same title filed on Jul. 31, 2017 which claims priority to U.S. provisional patent application No. 62/370,229 filed Aug. 2, 2016 and U.S. provisional patent application No. 62/368,705 filed Jul. 29, 2016. All three applications in their entireties are incorporated by reference herein.

BACKGROUND

Oil and gas operations require many components and much power to operate. Equipment such as drill motors, mud pumps, shakers, and many other components are used in remote locations and in challenging environments. Some drill rigs have employed trailers or other temporary installations equipped with electrical and mechanical equipment to help manage certain aspects of the drilling operation. Some common components found in these trailers include mud pumps, drawworks, top drives, and variable frequency drives (VFDs). VFDs (also known as adjustable-frequency drives, variable speed drives, AC drives, micro drives, or inverter drives) are a type of adjustable-speed drive used in electro-mechanical drive systems to control AC motor speed and torque by varying motor input frequency and voltage. VFDs are used in applications ranging from small appliances to large compressors. VFDs produce heat at a high rate that must be dissipated somehow to ensure proper operation and longevity of the components.

SUMMARY

Embodiments of the present disclosure are directed to an apparatus including a structure having an external wall and a variable frequency drive installed inside the structure. The variable frequency drive can have an insulated-gate bipolar transistor (IGBT) on a rear face of the variable frequency drive. The apparatus also includes an internal heat exchanger coupled to the rear face of the variable frequency drive and to a portion of the external wall. The internal heat exchanger conducts heat away from the IGBT and the external wall conducts heat away from the external heat exchanger. The apparatus also includes an external heat exchanger coupled to the external wall opposite the internal heat exchanger that conducts heat from the external wall. The apparatus can also include an adapter to thermally interface between the external wall and the interior heat exchanger. The external wall has a recess and the adapter is configured to fit at least partially within the recess. The adapter has a first side configured to conform to a portion of the external wall and a second side configured to conform to the internal heat exchanger.

Other embodiments of the present disclosure are directed to an apparatus for supporting electrical components and dissipating heat generated thereby. The apparatus can include a housing having an exterior wall and an electrical component within the housing, the electrical component having a heat-producing surface. It also has an adapter thermally coupled between the exterior wall of the housing and the heat-producing surface. The exterior wall of the housing has at least twice as much surface area as the heat-producing surface. The apparatus also has a heat exchanger coupled to the exterior wall.

Still further embodiments of the present disclosure are directed to a method including providing a structure having an electrical component support site, determining a configuration of heat-producing components of an electrical component, and providing at the electrical component support site on the structure an adapter with a plurality of panels. The adapter can thermally couple an electrical component with the structure such that the structure serves as a heat sink for the electrical components. The method also includes arranging the panels to include heat exchangers in panels corresponding to the heat-producing components and blanks in panels not corresponding to the heat-producing components, and coupling the electrical component to the structure via the adapter.

DETAILED DESCRIPTION

Figure 1:
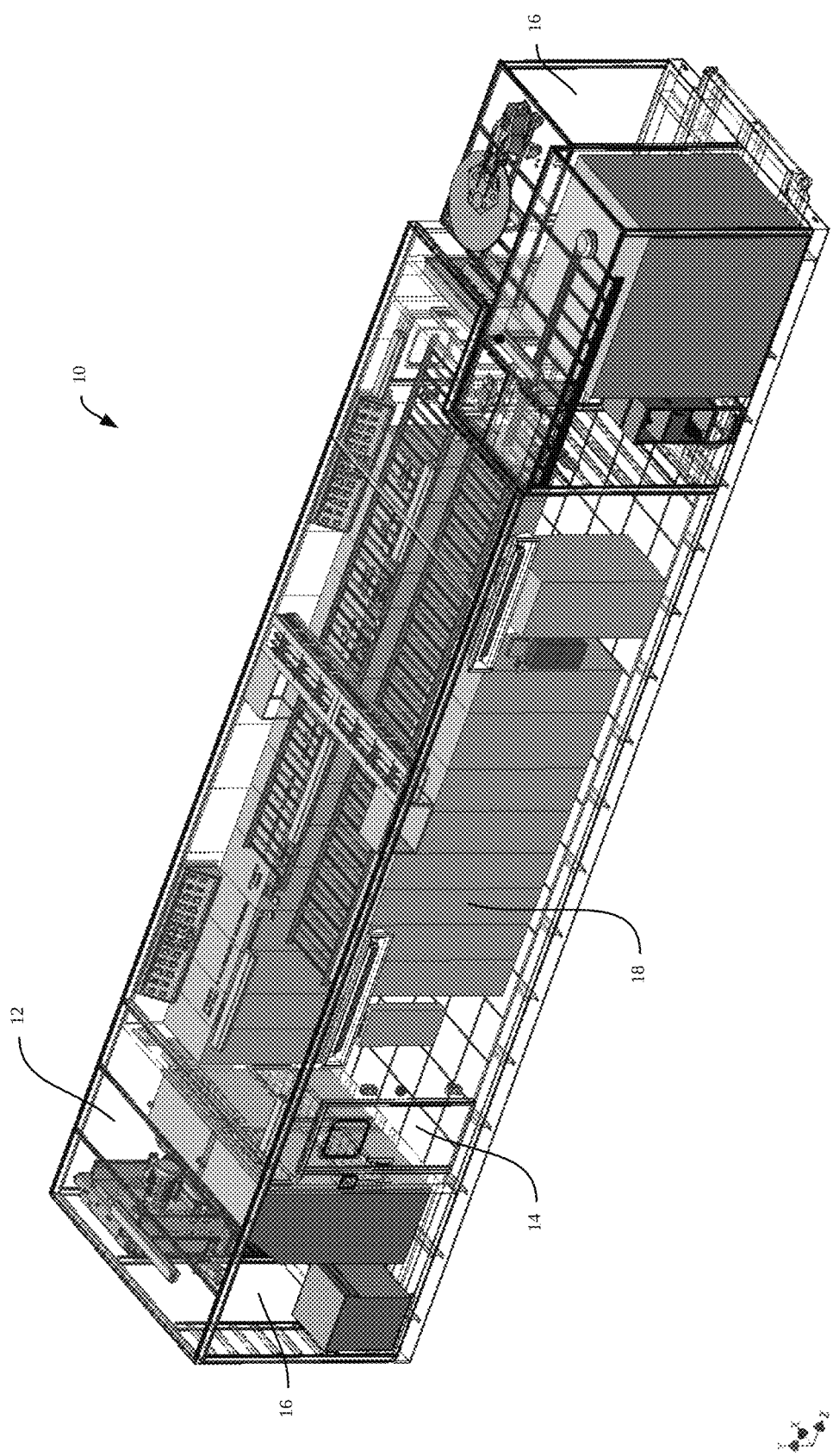
FIG. 1 is a perspective wireframe illustration of a trailer including various mechanical and electrical components according to embodiments of the present disclosure.

Below is a detailed description of apparatuses, systems, and methods for cooling electrical, mechanical, or industrial equipment using an exterior structure as a heat sink according to various embodiments of the present disclosure. FIG. 1 is a perspective wireframe illustration of a trailer 10 including various mechanical and electrical components according to embodiments of the present disclosure. The trailer 10 includes an outer structure including a roof 12, a door 14, and walls 16. The trailer 10 can be any physical structure such as a shed, a case, or a trailer. It may be big enough for personnel to enter or it may be built to house only the equipment. It may itself be housed inside another structure, or it can be outside exposed to ambient conditions. There can be any number of components installed in the trailer 10. One of these components is a VFD 18. The VFD 18 is constructed as a rectangular unit which stands in the trailer 10. Conventionally, VFDs are intended to be placed indoors and are cooled by an HVAC system in the building. With a trailer 10 or other similar installation however, the HVAC systems are less robust and inefficient when it comes to cooling such equipment.

Figure 2:
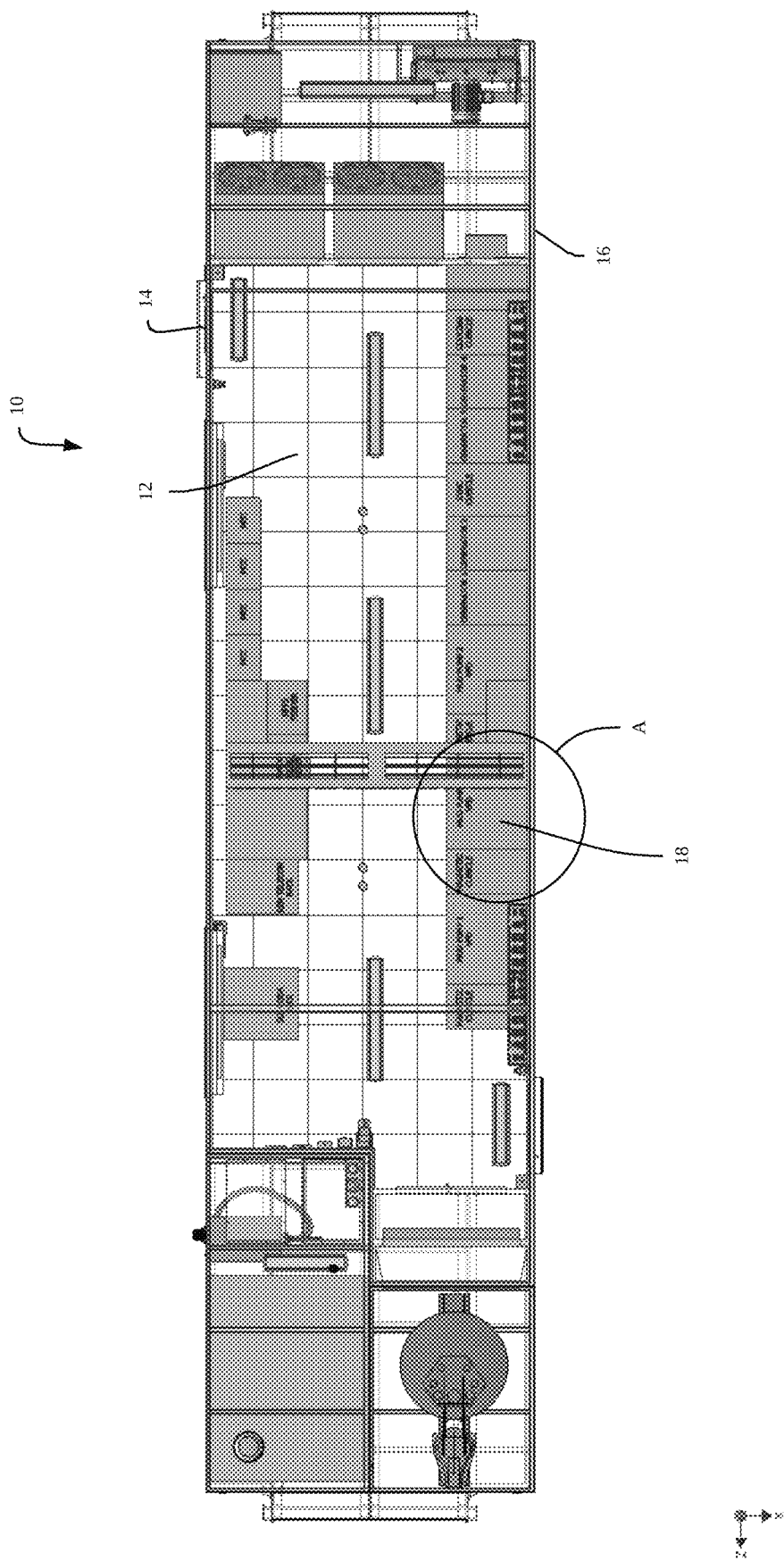
FIG. 2 is a top view of the trailer according to embodiments of the present disclosure.

FIG. 2 is a top view of the trailer 10 according to embodiments of the present disclosure. The VFD 18 is shown installed with a backside against the wall 16. Various other electrical and mechanical components are installed in the trailer 10 and the features and aspects of the present disclosure can also be applied to other components. For purposes of brevity and conciseness this disclosure will refer to the VFD 18 and describe systems and methods to dissipate heat generated by the VFD 18. Other components also generate heat and can be treated in similar fashion. There may be multiple VFDs 18 in a given installation. The heat from a VFD is primarily produced by an insulated-gate bipolar transistor (IGBT) which is an electronic switching (on/off) device and a primary component in VFD inverters. Dissipating the heat produced by the IGBTs will prolong the longevity of the components and promote efficient operation and prevents failure due to overheating. Many installations are limited in the size and amperage of the VFD they can implement because of the heat produced. The systems and methods disclosed herein will mitigate these constraints, permit redundant cooling methods to mitigate the constraints or loss of amperage capability due to the ability to operate liquid, air, or both media.

Figure 3A:
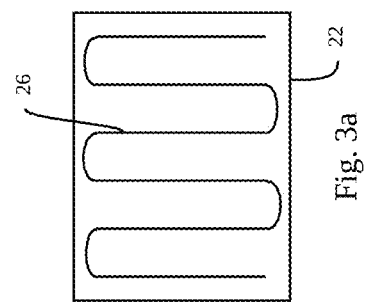
FIG. 3A is a sectional view of an internal heat exchanger according to embodiments of the present disclosure.
Figure 3:
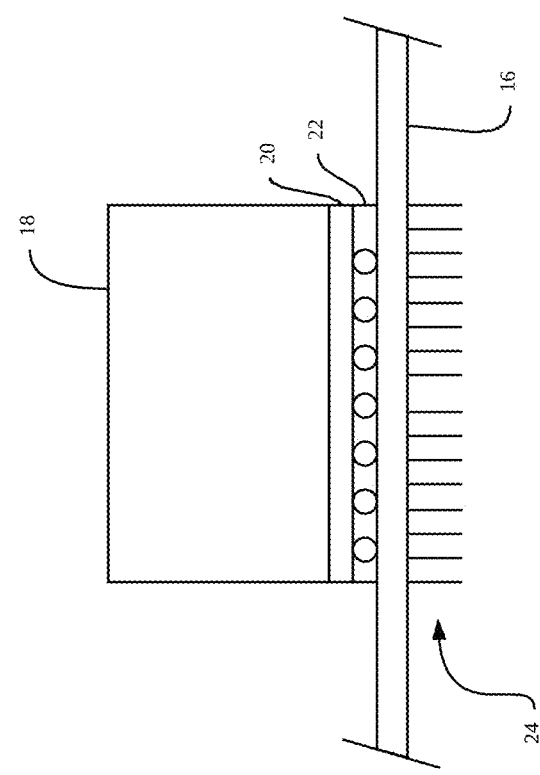
FIG. 3 is a schematic cut away top view of a variable frequency drive (VFD) and heat dissipating components shown in detail A of FIG. 2 according to embodiments of the present disclosure.

FIG. 3 is a schematic cut away top view of a VFD and heat dissipating components shown in detail A of FIG. 2 according to embodiments of the present disclosure. The VFD 18 includes an IGBT 20 on a backside of the VFD 18. There is internal heat exchanger 22 contacting the IGBT 20 and the wall 16, and an external heat exchanger 24 contacting the wall 16. These components operate together to dissipate heat from the IGBT 20 and into the environment, using the size and thermal capabilities of the wall of the trailer 10 as a heat sink to promote heat dissipation. The IGBT 20 is shown as being co-extensive with the VFD 18. In some embodiments the IGBT 20 is smaller than the VFD in which case the internal heat exchanger 20 and external heat exchanger 24 can be sized accordingly. The internal heat exchanger 22 can be a liquid cooling unit. FIG. 3a is a schematic side view of an internal heat exchanger 22 according to embodiments of the present disclosure. The internal heat exchanger 22 can include coils 26 which can conduct a coolant such as water or refrigerant or any other suitable cooling medium through the coils 26. The coolant can be circulated under pressure to continually remove heat from the IGBT 20. The internal heat exchanger 22 or the external heat exchanger 24 or both can be thermally coupled to an HVAC system of the trailer 10 or to ambient air. The internal heat exchanger 22 can operate with air instead of liquid. Other cooling mechanisms can be employed as well.

The wall 16 is shown in cut away section, but it can be much larger than the VFD 18. The large size of the wall 16 make it an excellent heat sink for heat produced by the VFD 18 and IGBT 20. The wall 16 can be thermally coupled to other components of the trailer 10, including the roof 12, door 14, and even the floor. The trailer 10 can be constructed out of a thermally conductive material such as aluminum or steel. In some embodiments the joints between components of the wall 16 can be thermally conductive such that heat can dissipate from the portion of the wall 16 contacting the VFD 18 to other remote portions of the trailer structure.

The external heat exchanger 24 is shown including a plurality of fins extending outward from the wall 16. Fins are chosen to increase surface area of the exchanger. Other configurations are possible, including a simple flat plate of thermally conductive material. The external heat exchanger 24 can also be cooled by ambient air, or an HVAC system of the trailer 10 can blow air or another suitable fluid or gas over the fins.

Figure 4B:
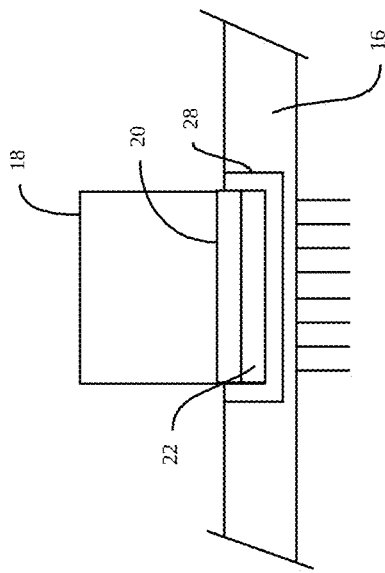
FIG. 4b is a schematic cut away top view of a VFD similar to FIG. 4b with a different adapter configuration according to embodiments of the present disclosure.
Figure 4A:
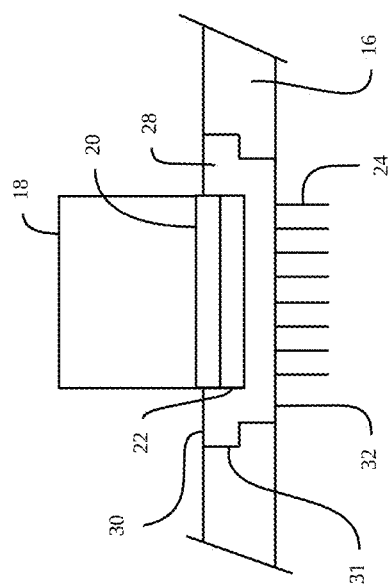
FIG. 4a is a schematic cut away top view of a VFD in a similar perspective as FIG. 3 according to embodiments of the present disclosure.

FIG. 4a is a schematic cut away top view of a VFD 18 in a similar perspective as FIG. 3 according to embodiments of the present disclosure. The VFD 18, IGBT 20, internal heat exchanger 22, wall 16, and external heat exchanger 24 are shown and operate in a similar manner to what is shown and described above with respect to FIGS. 3 and 3a. The wall 16 has a cut out and there is an adapter 28 which has a first side 30 facing inward toward the VFD 18 and a second side 32 facing toward the wall 16. The adapter 28 is sized to accommodate the VFD 18, IGBT 20, and internal heat exchanger 22 on the first side, and to accommodate the wall 16 on the second side. The adapter 28 can be installed into the wall 16 with the first side 30 flush with the interior side of the wall 16, or with the second side 32 flush with the exterior side of the wall 16, or both the first side 30 and second side 32 flush with the wall 16. The adapter 28 is shown with a stepped profile 31 that matches a corresponding profile on the wall 16. Any suitable profile 31 can be chosen to allow installation from the interior or from the exterior, or both the interior or exterior.

FIG. 4b is a schematic cut away top view of a VFD 18 similar to FIG. 4b with a different adapter configuration. The wall 16 has no cut out and instead has a recess that does not pass all the way through the wall 16. The adapter 28, heat exchanger 22, and IGBT 20 are nested together in thermal contact with the wall 16. The profile of the adapter 28 is different as well to accommodate the different shape of the wall 16 and recess. In other embodiments the wall 16 can have no recess at all and instead is flat. The wall 16 can still be coupled to the adapter 28 and other components. In some embodiments there is no adapter. The wall may be flat or have a protruding support site that is configured to couple to the heat exchanger 22 and the IGBT 20. In some embodiments there are multiple components coupled to multiple support sites, whether they are cut outs, recesses, flat spaces, or protruding sites.

There can be multiple adapters 28 of different sizes to accommodate different configurations. As stated elsewhere herein, the source of the heat can be any of the various components in the trailer 10 and there can be a different adapter 28 for each component. The trailer 10 can be built with multiple locations available for different adapters 28, to allow flexibility in constructing the trailer 10. Components can be rearranged as needed. Different internal or external heat exchangers can be used for different components according to their heat output or other heat creation or insulation needs. The adapter 28 can be thermally conductive with the wall 16 and the internal heat exchanger 22, the external heat exchanger 24, and even the IGBT 20 itself.

The present disclosure can also be constructed to address cold temperatures. Any one or more of the internal heat exchanger 22, adapter 28, wall 16, or external heat exchanger 24 can be changed to an insulator to maintain heat within the components for a cold installation. The heat exchangers can be structurally the same but can be operated in such a way to promote insulation rather than heat dissipation. This flexibility allows a manufacturer to construct a single trailer 10 that can be suitable for use in any environment from the hottest to the coldest on earth.

Figure 5:
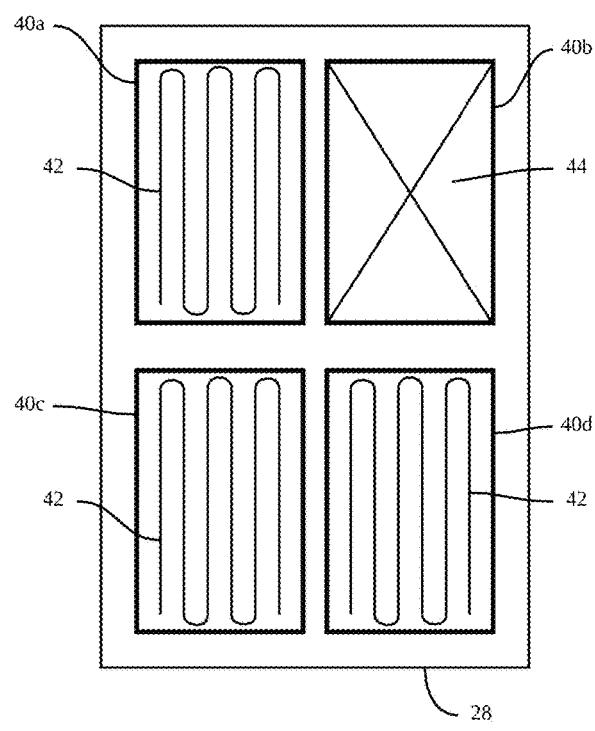
FIG. 5 is a schematic illustration of an adapter and multiple internal heat exchangers according to embodiments of the present disclosure.

FIG. 5 is a schematic illustration of an adapter 28 and multiple internal heat exchangers 22 according to embodiments of the present disclosure. FIG. 5 shows an interior side of the adapter 28 with no VFD installed. The adapter 28 has four panels, 40a, 40b, 40c, and 40d. Panels 40a, 40c, and 40d have heat exchangers 42 installed that can be coextensive with the panel, while panel 40b has a blank 44. In a given installation there will be a need for a total amperage rating from a VFD. Because VFDs are manufactured at discrete amperage ratings and it is cost-prohibitive to custom order a VFD with precise amperage ratings for a given installation, it is common practice to operate any number of VFDs together to arrive at a desired amperage. For example, suppose there is a need for 3000 amps from a VFD, but VFDs are available in ratings of 250, 500, 1000, and 5000 amps. Three, 1000 amp VFDs can be put in each of panels 40*a*, 40*c*, and 40*d* to reach the required amperage rating. The adapter 28 can have any number of panels, the panels can be different sizes, and can have different heat dissipating characteristics. The blank 44 can be essentially the same material as the wall in which it will be found.

Figure 6:
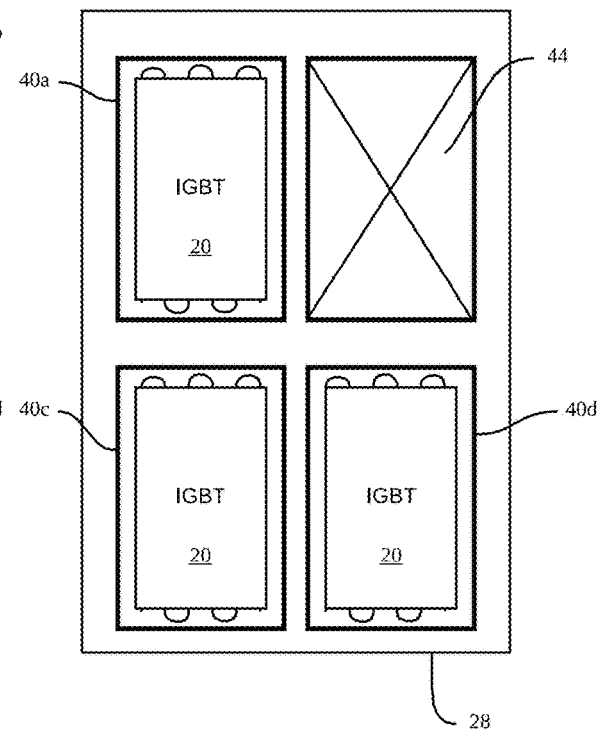
FIG. 6 shows the adapter and panels of FIG. 5 and insulated-gate bipolar transistors (IGBTs) installed according to embodiments of the present disclosure.

FIG. 6 shows the adapter 28 and panels 40*a*-40*d* of FIG. 5 and IGBTs 20 installed according to embodiments of the present disclosure. A single VFD can feature multiple IGBTs 20, and the panels and corresponding heat exchangers can be chosen to fit a given VFD configuration. The systems and methods described herein allow for improved flexibility and efficiency for a trailer installation. The HVAC systems for the trailer can be smaller (and in some cases omitted entirely) than what would have been needed without the systems and methods of the present disclosure. The installation can fit a wide variety of heat-producing components using different adapters and panels to fit the needs of the different components. Manufacturing costs are reduced because the trailer can be constructed having any desired number of stations configured to receive an adapter. There can be any desired number of adapters which can accommodate different components. The use of the heat exchangers and the size of the wall for a heat sink will effectively manage the heat loads created by the components of the trailer.

The foregoing disclosure has been described with reference to the various figures and embodiments. It is understood by a person of ordinary skill in the art there may be variations or modifications not specifically discussed that nevertheless fall within the scope of the present disclosure.

The invention claimed is:

1. A method, comprising:
   providing a structure having an electrical component support site;
   determining a configuration of heat-producing components of an electrical component;
   providing at the electrical component support site on the structure an adapter with a plurality of panels, the adapter being configured to thermally couple an electrical component with the structure such that the structure serves as a heat sink for the electrical components;
   arranging the panels to include heat exchangers in panels corresponding to the heat-producing components and blanks in panels not corresponding to the heat-producing components; and
   coupling the electrical component to the structure via the adapter.

2. The method of claim 1, further comprising operating the heat exchangers by running at least one of forced air or forced liquid through the heat exchangers.

3. The method of claim 1, further comprising providing an external heat exchanger on an exterior surface of the structure.

4. The method of claim 1, wherein the heat-producing components comprise an insulated-gate bipolar transistor.

5. The method of claim 1, wherein the adapter has a first side configured to conform to a portion of a panel and a second side configured to conform to the heat sink.

6. The method of claim 1, wherein the heat sink is a liquid-cooled heat exchanger.

7. The method of claim 1, wherein the heat sink is an air-cooled heat exchanger.

8. The method of claim 1, wherein at least one of the panels has an area that is at least twice as large as the rear face of the variable frequency drive.

9. The method of claim 1, wherein the heat sink comprises a plurality of fins configured to passively transfer thermal energy.

* * * * *